(12) United States Patent
Aramaki et al.

(10) Patent No.: US 8,668,792 B2
(45) Date of Patent: Mar. 11, 2014

(54) METHOD FOR PRODUCING MAGNETIC SHEET

(75) Inventors: Keisuke Aramaki, Tochigi (JP); Yoshihisa Shinya, Tochigi (JP); Katsuhiko Komuro, Tochigi (JP)

(73) Assignee: Dexerials Corporation, Minato-Ku, Tokyo (JP)

( * ) Notice: Subject to any disclaimer, the term of this patent is extended or adjusted under 35 U.S.C. 154(b) by 0 days.

(21) Appl. No.: 13/447,432

(22) Filed: Apr. 16, 2012

(65) Prior Publication Data

US 2012/0205025 A1 Aug. 16, 2012

Related U.S. Application Data

(60) Division of application No. 12/854,472, filed on Aug. 11, 2010, which is a continuation of application No. PCT/JP2009/052720, filed on Feb. 17, 2009.

(30) Foreign Application Priority Data

Feb. 18, 2008 (JP) ................................. 2008-036349

(51) Int. Cl.
- H01F 41/02 (2006.01)
- B32B 37/10 (2006.01)
- B32B 37/06 (2006.01)
- H01F 41/14 (2006.01)
- B05D 3/02 (2006.01)

(52) U.S. Cl.
USPC .......................................... 156/60; 427/130

(58) Field of Classification Search
USPC ..................... 156/60, 220; 427/130
See application file for complete search history.

(56) References Cited

U.S. PATENT DOCUMENTS

2007/0154820 A1 7/2007 Kang et al.

FOREIGN PATENT DOCUMENTS

| EP | 1533343 A1 | 5/2005 |
| FR | 2727416 A1 | 5/1996 |

(Continued)

OTHER PUBLICATIONS

International Search Report (PCT/ISA/210) issued on May 12, 2009, by Japanese Patent Office as the International Searching Authority for International Application No. PCT/JP2009/052720.

(Continued)

*Primary Examiner* — Michael Orlando
*Assistant Examiner* — Daniel Lee
(74) *Attorney, Agent, or Firm* — Buchanan Ingersoll & Rooney PC

(57) ABSTRACT

A method for producing a magnetic sheet wherein a magnetic sheet composition is applied onto a substrate. The magnetic sheet composition contains: a binder; magnetic powder; and a curing agent, wherein the binder contains a thermosetting organic resin, and the curing agent contains a sulfonium borate complex expressed by General Formula 1:

General Formula 1

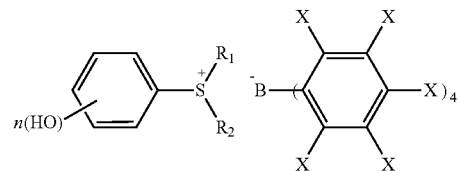

where $R_1$ is an aralkyl group, $R_2$ is a lower alkyl group, X is a halogen atom, and n is an integer of 0 to 3.

2 Claims, 5 Drawing Sheets

(56) References Cited

FOREIGN PATENT DOCUMENTS

| | | | |
|---|---|---|---|
| JP | 3-237107 A | | 10/1991 |
| JP | 4-1177 A | | 1/1992 |
| JP | 9-176112 A | | 7/1997 |
| JP | 09176112 A | * | 7/1997 |
| JP | 2002-164688 A | | 6/2002 |
| JP | 2005-236219 A | | 9/2005 |
| JP | 2007-95829 A | | 4/2007 |
| JP | 2007095829 A | * | 4/2007 |

OTHER PUBLICATIONS

Written Opinion (PCT/ISA/237) issued on May 12, 2009, by Japanese Patent Office as the International Searching Authority for International Application No. PCT/JP2009/052720.

International Preliminary Report on Patentability (PCT/IPEA/409) issued on May 12, 2009, by Japanese Patent Office as the International Examining Authority for International Application No. PCT/JP2009/052720.

* cited by examiner

METHOD FOR PRODUCING MAGNETIC SHEET

CROSS-REFERENCE TO RELATED APPLICATION

This application is a divisional of U.S. patent application Ser. No. 12/854,472 filed on Aug. 11, 2010, which is a Continuation of International Application No. PCT/JP2009/05270, filed on Feb. 17, 2009, which claims the benefit of priority from Japanese Patent Application No. 2008/036349, filed on Feb. 18, 2008, the contents of each are herein incorporated by reference in their entirety.

BACKGROUND OF THE INVENTION

1. Field of the Invention

The present invention relates to a magnetic sheet, which is capable of suppressing undesirable electromagnetic waves emitted from an electronic equipment, and inhibiting electromagnetic disorders caused due to the interference of the undesirable electromagnetic waves, and also relates to a production method thereof which is efficient and low cost.

2. Description of the Related Art

The magnetic sheets are used for depression of noise, or for RFID. For the purpose of depression of noise, along with rapid developments of electronic equipments, e.g. personal computers and mobile phones, such as down sizing and higher frequency, these electronic equipments suffer from a noise interference due to outer electromagnetic waves and interference of noises occurred within the electronic equipment. In order to suppress such interferences, various countermeasures have been taken for the noises. For example, a magnetic sheet (noise depressing sheet) is disposed adjacent to a noise emitting source or a noise receiving source.

The magnetic sheet is formed by adding alloy (magnetic powder) such as Fe—Si—Al to an epoxy resin, acrylic resin, or the like, and then being cured to form into a sheet by hot pressing. The magnetic powder inhibits noise, and functions as a so-called noise depressor. The better the effect of inhibiting the noise of the magnetic sheet is, the larger an imaginary part $\mu''$ of the magnetic permeability of the magnetic sheet is.

On the other hand, in the case where the magnetic sheets are used for RFID, as a recent trend in the art, radio communication using a coil antenna in an electromagnetic induction method, which is represented as mobile information terminals having IC tags referred as Radio Frequency Identification (RFID), has been widely used. For example, in the mobile information terminal, various conductors (metals) such as a metal casing or metal parts are disposed adjacent to an antenna element for transmitting and receiving due to downsizing of the mobile information terminal. In this case, a magnetic field usable for the transmission is largely attenuated because of the metal present adjacent to the antenna element, and as a result, a communication distance for RFID transmission in an electromagnetic induction system may be shortened, or transmission or receiving of a radio frequency may become difficult because a resonance frequency is shifted. To prevent these electromagnetic disorders, a magnetic sheet is placed between the antenna element and the conductor. As for a function of RFID, it is preferred that the magnetic sheet has a large real part $\mu'$ of the magnetic permeability, and a small imaginary part $\mu''$ of the magnetic permeability.

A curing agent (i.e. a crosslinking agent) for curing a thermosetting organic resin is generally added to a magnetic sheet composition that is a material of the magnetic sheet. The magnetic sheet is hardened by adding the curing agent to the magnetic sheet composition. Especially in the case where a polymer material for use in the magnetic sheet easily absorbs moisture, however, the thickness of the magnetic sheet undesirably changes depending on the fluctuations in the environment such as temperature and humidity. In order to sufficiently cure the magnetic sheet in such environment, the curing temperature is set high and the curing duration is set long. In this case, a large volume of water is consumed as the cooling duration becomes long according to the long and high temperature curing, and moreover the production efficiency decreases. If the curing temperature is set high and the curing duration is set short to solve the aforementioned problem, a problem occurs in the heat resistance of an insulating support.

Moreover, a sulfonium-based cationic curing agent has been commonly used as the conventional curing agent, but the sulfonium-based cationic curing agent contains antimony that is toxic. Therefore, use of such curing agent gives an adverse influence to the environment. Furthermore, as in this antimony-containing sulfonium-based cationic curing agent, a counter ion has a Sb—F bond, which has weak bonding force, a $F^{-1}$ ion tends to be free. For this reason, in the case where the magnetic sheet containing the antimony-containing cationic curing agent is used around a wiring, the free $F^{-1}$ ion reacts with water to form hydrofluoric acid, which causes corrosion of the wiring.

For example, Japanese Patent Application Laid-Open (JP-A) No. 2007-95829 describes photocuring of a magnetic binder containing a photocuring cationic curing agent, and discloses an electromagnetic-wave-absorbing sheet having a concentration distribution of magnetic filler from the surface of the sheet towards the depth direction thereof. The curing of this electromagnetic-wave-absorbing sheet is performed by a drum device.

BRIEF SUMMARY OF THE INVENTION

The present invention aims at solving the problems in the art, and achieving the following objects. Namely, an object of the present invention is to provide a magnetic sheet composition, which is a material of a magnetic sheet, capable of reducing unnecessary electromagnetic waves released from an electronic equipment, is capable of inhibiting electromagnetic disorders caused by an interference of unnecessary electromagnetic waves within an electronic equipment, prevents liberation of halogen ions to thereby prevent corrosion of wirings when it is used around the wirings, and does not give any adverse influence to the environment. Another object of the present invention is to provide a method for producing a magnetic sheet using such magnetic sheet composition, and a magnetic sheet produced by such method for producing a magnetic sheet.

The inventors of the present invention have intensively studied to solve the problems, and come to the following insights. Namely, the inventors have found a magnetic sheet composition containing at least a binder which contains a thermosetting organic resin, a magnetic powder, and a curing agent which contains a sulfonium borate complex expressed by General Formula 1 can produce a magnetic sheet which realizes low-temperature-high-speed curing, prevents libration of halogen ions so as to prevent corrosion of wirings when it is used around the wirings, gives less environmental load.

General Formula 1

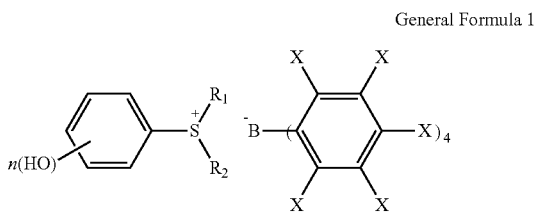

In General Formula 1, $R_1$ is an aralkyl group, $R_2$ is a lower alkyl group, X is a halogen atom, and n is an integer of 0 to 3.

The present invention has been made based upon the insight of the present inventors, and means for solving the aforementioned problems are as follows.

<1> A magnetic sheet composition, containing:
  a binder;
  magnetic powder; and
  a curing agent,
wherein the binder contains a thermosetting organic resin, and the curing agent contains a sulfonium borate complex expressed by General Formula 1:

General Formula 1

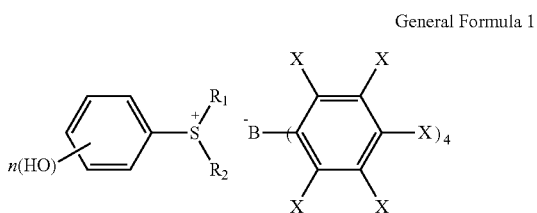

where $R_1$ is an aralkyl group, $R_2$ is a lower alkyl group, X is a halogen atom, and n is an integer of 0 to 3.

Since the magnetic sheet composition according to <1> contains the curing agent, which does not contain antimony, it will provide a less load to the environment. Moreover, as the bonding energy of X (halogen atom) and a phenyl group in the sulfonium borate complex expressed by General Formula 1, the bond between X (halogen atom) and the phenyl group is unlikely broken, and thus the isolation of X (halogen atom) ions is prevented. Therefore, the generation of acid such as hydrofluoric acid as a result of the reaction between free X (halogen atom) ions and water or the like is prevented. For this reason, corrosion of wirings can be prevented even when a magnetic sheet formed using the magnetic sheet composition is used around the wirings. Furthermore, a cationic curing magnetic sheet curable at low temperature and at high speed can be provided.

<2> The magnetic sheet composition according to <1>, wherein $R_1$ is a benzyl group, an o-methyl benzyl group, or a (1-naphthyl)methyl group.

<3> The magnetic sheet composition according to any of <1> or <2>, wherein $R_2$ is a methyl group.

<4> The magnetic sheet composition according to any one of <1> to <3>, wherein the sulfonium borate complex is contained in an amount of 2 parts by mass to 15 parts by mass relative to 106.1 parts by mass of the binder.

<5> The magnetic sheet composition according to any one of <1> to <4>, further containing a flame retardant, wherein the flame retardant contains carboxylic acid amide-containing melamine cyanurate.

<6> A method for producing a magnetic sheet, containing:
  applying the magnetic sheet composition as defined in any one of <1> to <5> onto a substrate;
  drying the magnetic sheet composition applied onto the substrate; and
  thermosetting the dried magnetic sheet composition.

<7> The method for producing a magnetic sheet according to <6>, further containing:
  stacking a convex-concave forming layer and a pattern transferring layer on a surface of a magnetic layer, which is formed by thermosetting the magnetic sheet composition, in this order from the side of the magnetic layer so as to form a stacked body; and
  hot-pressing the stacked body so as to transfer a surface configuration of the pattern transferring layer to surfaces of the convex-concave forming layer and the magnetic layer, as well as bonding the convex-concave forming layer and the magnetic layer together.

<8> A magnetic sheet, obtained by the method as defined in any of <6> or <7>.

In accordance with the present invention, the various problems in the art can be solved, and there can be provided a magnetic sheet composition, which is a material of a magnetic sheet, capable of reducing unnecessary electromagnetic waves released from an electronic equipment, is capable of inhibiting electromagnetic disorders caused by an interference of unnecessary electromagnetic waves within an electronic equipment, prevents libration of halogen ions to thereby prevent corrosion of wirings when it is used around the wirings, and does not give any adverse influence to the environment, as well as providing a method for producing a magnetic sheet using such magnetic sheet composition, and a magnetic sheet produced by such method for producing a magnetic sheet.

BRIEF DESCRIPTION OF THE DRAWINGS

FIG. 1 is a $^1$H-NMR chart of the sulfonium borate complex expressed by the formula 1a.

Figure 1:
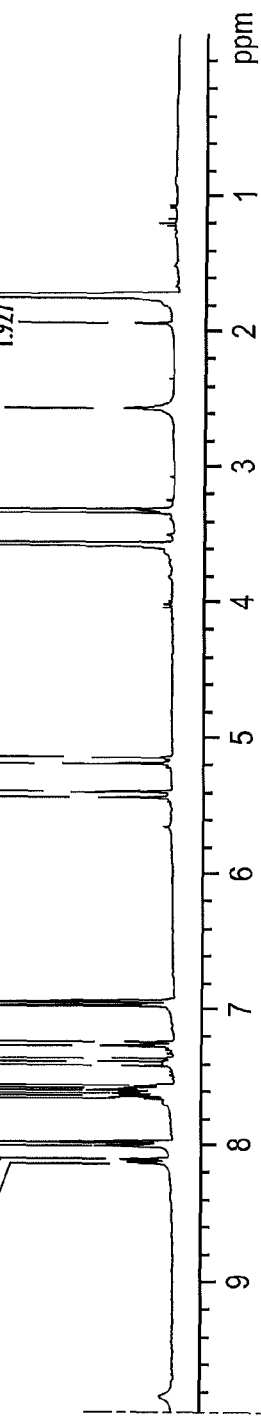

DETAILED DESCRIPTION OF THE INVENTION (Magnetic Sheet Composition)

The magnetic sheet composition of the present invention contains at least a binder, a magnetic powder, and a curing agent, and may further contain other components, if necessary.

—Curing Agent—

The curing agent is suitably selected depending on the intended purpose without any restriction, provided that it contains the sulfonium borate complex expressed by General Formula 1:

General Formula 1

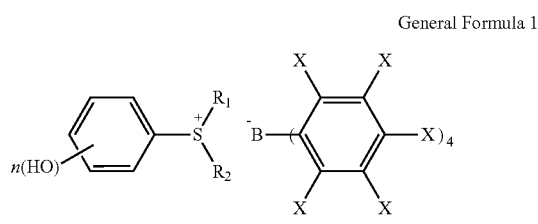

In General Formula 1, $R_1$ is an aralkyl group, $R_2$ is a lower alkyl group, X is a halogen atom, and n is an integer of 0 to 3.

Examples of the aralkyl group expressed as $R_1$ include a benzyl group, an α-methyl benzyl group, a (1-naphthyl)methyl group, a pyridyl methyl group, and an anthracenyl methyl group. Among them, the (1-naphthyl)methyl group is preferable as it provides the curing agent with excellent and fast curing ability, and it is readily available.

Examples of the lower alkyl group expressed as $R_2$ include a methyl group, an ethyl group, a propyl group, and a butyl group. Among them, the methyl group is preferable as it provides the curing agent with excellent and fast curing ability, and it is readily available.

"n" is an integer of 0 to 3, where n denotes a number of hydroxyl group(s) contained in phenyl group(s) bonded to the sulfonium residue. In the case where n is 1, examples of such phenyl group include a 4-hydroxyl phenyl group, a 2-hydroxyl phenyl group, and a 3-hydroxyl phenyl group. In the case where n is 2, examples of such phenyl group include a 2,4-dihydroxyl phenyl group, a 2,6-dihydroxyl phenyl group, a 3,5-dihydroxyl phenyl group, and a 2,3-dihydroxyl phenyl group. In the case where n is 3, examples of such phenyl group include a 2,4,6-trihydroxy phenyl group, a 2,4,5-trihydroxy phenyl group, and a 2,3,4-trihydroxy phenyl group. Among them, the 4-hydroxy phenyl group is preferable, as it provides the curing agent with excellent and fast curing ability, and it is readily available.

Examples of the halogen atom expressed as X include a fluorine atom, chlorine atom, bromine atom, and iodine atom. Among them, the fluorine atom having high electron-withdrawing properties is preferable for improving the reactivity.

The sulfonium borate complex expressed by General Formula 1 can be produced in accordance with the following reaction formula. In General Formulae 1 to 3, $R_1$ is an aralkyl group, $R_2$ is a lower alkyl group, X is a halogen atom, and n is an integer of 0 to 3.

<Reaction Formula>

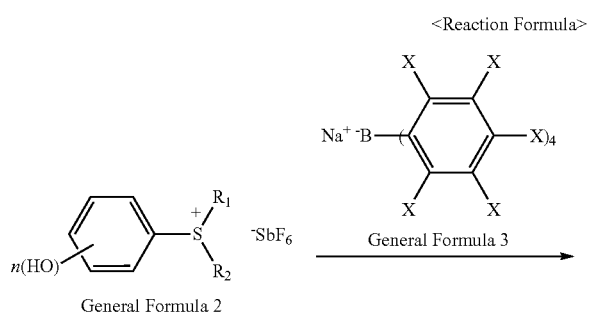

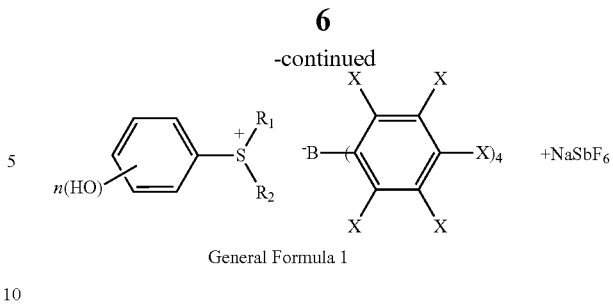

General Formula 1

Namely, the sulfonium antimonate complex (see JP-A No. 10-245378 for a synthesis method thereof) expressed by General Formula 2 is made dissolved in an organic solvent such as ethyl acetate, and a solution of sodium borate (see JP-A No. 10-310587 for a synthesis method thereof) expressed by General Formula 3 is mixed to the aforementioned solution in the equimolecular amount. The obtained two-layered mixture is stirred at the temperature of 20° C. to 80° C. for 1 hour to 3 hours so as to allow the sulfonium antimonate complex expressed by General Formula 2 to react with the sodium borate expressed by General Formula 3 to thereby obtain a sulfonium borate complex expressed by General Formula 1. The isolation of the sulfonium borate complex expressed by General Formula 1 can be performed in the following manner. Specifically, the organic solvent layer is separated and dried, and the organic solvent is evaporated to remove under the reduced pressure so that the specified substance can be obtained as the evaporated residue.

The sulfonium borate complex expressed by General Formula 1 can be used as a thermal cationic polymerization initiator for a common epoxy resin. In this case, an epoxy resin composition (in the form of a paste or film) containing 100 parts by mass of an epoxy resin and 0.1 parts by mass to 10 parts by mass of the sulfonium borate complex expressed by General Formula 1 as the thermal cationic polymerization initiator is heated at 50° C. to 150° C. so as to provide a cured product which is excellent in electrolytic corrosion resistance, and is cured at high speed and low temperature.

—Binder—

The binder is suitably selected depending on the intended purpose without any restriction. Examples thereof include acrylic rubber containing a thermosetting organic resin, which will be mentioned later.

The acrylic rubber preferably contains epoxy groups. In this case, the epoxy groups are reacted with a curing agent, so as to improve reliability. Moreover, the acrylic rubber preferably further contains hydroxyl groups. The hydroxyl groups are contained in the acrylic rubber, so as to improve adhesion.

The mass average molecular mass of the acrylic rubber is 10,000 to 450,000 in terms of excellent coating ability.

When the mass average molecular mass is less than 10,000, the viscosity of the magnetic sheet composition decreases, and it becomes hard to apply the magnetic sheet composition containing the magnetic powder having a large mass. When the mass average molecular mass is more than 450,000, the viscosity of the magnetic sheet composition becomes large, and it becomes hard to apply the magnetic sheet composition having a large viscosity.

The glass transition temperature of the acrylic rubber is preferably −50° C. to +15° C.

When the glass transition temperature is lower than −50° C., the reliability at a high temperature or in a high temperature and high humidity environment may become poor. When the glass transition temperature is higher than +15° C., the magnetic sheet tends to be hard.

Moreover, one or more acrylic rubbers may be used in combination.

—Thermosetting Organic Resin—

Examples of the thermosetting organic resin include an epoxy resin. When an epoxy resin having a small molecular mass is added, the melt viscosity of the binder is further decreased upon compressing (forming) the magnetic sheet. Thus, the magnetic properties can be increased. Moreover, for example, by using a polyfunctional epoxy resin, the reliability of the magnetic sheet after curing can be further improved.

Examples of the epoxy resin include a cation-curing epoxy resin. The epoxy resin may be used independently, or in combination.

—Magnetic Powder—

The magnetic powder is suitably selected depending on the intended purpose without any restriction. Examples of the shape of the magnetic powder include a flat, lump, fiber, sphere, and irregular shape. Of these, the flat shape is preferable as the magnetic powder of such shape can be easily orientated in a predetermined direction and high magnetic permeability can be attained.

Examples of the magnetic powder include soft magnetic metal, ferrite, and pure iron particles.

Examples of the soft magnetic metal include magnetic stainless steel (i.e., Fe—Cr—Al—Si alloy), Sendust (i.e., Fe—Si—Al alloy), permalloy (i.e., Fe—Ni alloy), silicon copper (i.e., Fe—Cu—Si alloy), Fe—Si alloy, Fe—Si—B(—Cu—Nb) alloy, Fe—Ni—Cr—Si alloy, Fe—Si—Cr alloy, Fe—Si—Al—Ni—Cr alloy, and amorphous metal.

The magnetic powder may be used independently, or in combination.

The amounts of the binder, magnetic powder, and curing agent are each suitably selected depending on the intended purpose without any restriction. It is preferred that the amount of the magnetic powder be 400 parts by mass to 1,400 parts by mass and the amount of the sulfonium borate complex as the curing agent be 2 parts by mass to 15 parts by mass, both relative to 106.1 parts by mass of the binder. Note that, the proportion of the magnetic powder in the magnetic sheet is preferably 60% by weight to 95% by weight.

When the amount of the magnetic powder is less than 400 parts by mass relative to 106.1 parts by mass of the binder, excellent magnetic properties may not be obtained. When the amount thereof is more than 1,400 parts by mass relative to 106.1 parts by mass of the binder, it becomes hard to bind the magnetic powder with the binder. Consequently, the thickness variation of the magnetic sheet becomes large in a high temperature and high humidity environment, and the flame retardant may bleed out on the surface of the magnetic sheet. Moreover, the magnetic sheet becomes brittle, and the magnetic powder falls off (powder falling) not only from an edge face of the magnetic sheet but also from a surface of the magnetic sheet.

—Other Components—

The other components are suitably selected from various known additives depending on the intended purpose without any restriction, as long as the effect of the present invention is not impaired. For the purpose of improving the coating ability (i.e. adjusting the viscosity) of a magnetic composition, which is prepared by adding the magnetic powder and the flame retardant to the binder, a solvent may be added. Examples of the solvent include: ketones such as acetone, methylethyl ketone, methylisobutyl ketone, and cyclohexanone; alcohols such as methanol, ethanol, propanol, butanol, isopropyl alcohol; esters such as methyl acetate, ethyl acetate, propyl acetate, butyl acetate, ethyl lactate, and ethyl glycol acetate; ethers such as diethylene glycol dimethyl ether, 2-ethoxy ethanol, tetrahydrofuran, and dioxane; aromatic hydrocarbon compounds such as benzene, toluene, and xylene; and halogenated hydrocarbon compounds such as methylene chloride, ethylene chloride, carbon tetrachloride, chloroform, chlorobenzene. These may be used independently or in combination.

If necessary, various additives, such as a flame retardant (e.g. melamine cyanurate, and red phosphorous), a dispersant, stabilizer, lubricant, silane or titanate coupling agent, filler, plasticizer, and antioxidant may be added.

The amounts of the other components are suitably selected depending on the amounts of the binder, the magnetic powder and the curing agent, without any restriction.

—Carboxylic Acid Amide-Containing Melamine Cyanurate—

The presence of the carboxylic acid amide in the carboxylic acid amide-containing melamine cyanurate can be confirmed, for example, by pyrolysis gas chromatography analysis (Py-GC-MS).

The number average particle size of the carboxylic acid amide-containing melamine cyanurate is suitably selected depending on the intended purpose without any restriction. It is preferably 1 μm or less.

When the number average particle size is more than 1 μm, the close alignment of the magnetic powder is blocked, and the magnetic properties of the magnetic sheet may be degraded, and the thickness variation of the magnetic sheet may become large at high temperature or in a high temperature and high humidity environment.

The number average particle size of the carboxylic acid amide-containing melamine cyanurate can be obtained, for example, from a particle size distribution thereof measured by laser diffraction.

The carboxylic acid amide-containing melamine cyanurate may be a commercially available product or arbitrarily prepared product.

Examples of the commercially available product include MC-5F (manufactured by SAKAI CHEMICAL INDUSTRY, CO., LTD.).

A method for producing the carboxylic acid amide-containing melamine cyanurate is suitably selected depending on the intended purpose without any restriction. For example, a method for treating a surface of the melamine cyanurate using fatty acid is preferably used.

A surface treatment method is suitably selected from known methods depending on the intended purpose without any restriction. For example, a method of mixing and stirring the melamine cyanurate and the fatty acid is used.

When the surface of the melamine cyanurate is treated with the fatty acid, it is considered that an amino group in the melamine cyanurate is reacted with the fatty acid, and as a result, an amide compound is formed, as represented by the following reaction formula 1. Thus, an analysis is performed by pyrolysis gas chromatography (Py-GC-MS), so as to confirm the presence of the carboxylic acid amide.

—NH$_2$+R—COOH→R—CONH—  Reaction Formula 1

The fatty acid is suitably selected depending on the intended purpose without any restriction. Examples thereof include lauric acid, isostearic acid, stearic acid, palmitic acid, oleic acid, and linolenic acid. These may be used independently, or in combination. Among these, lauric acid is preferred, in terms of high hydrophobicity and favorable dispersibility.

—Red Phosphorus—

The flame retardant preferably contains red phosphorus, in addition to the silicon atom-containing melamine cyanurate and the carboxylic acid amide-containing melamine cyanurate. This is advantageous in terms of further improving the flame retardant of the magnetic sheet.

The red phosphorus is suitably selected depending on the intended purpose without any restriction, and may be a commercially available product or arbitrarily prepared product. It is preferred that the surface of the red phosphorus be coated for providing excellent humidity resistance, and favorable stability owing to no spontaneous combustion upon mixing.

As the red phosphorus whose surface is coated, red phosphorus whose surface is treated with aluminum hydroxide is exemplified.

The amount of the red phosphorus is suitably selected depending on the intended purpose without any restriction. It is preferably 6 parts by mass to 19 parts by mass, relative to the 100 parts by mass of the binder.

When the amount is less than 6 parts by mass, the obtainable effect of improving the flame resistance cannot be obtained. When the amount is more than 19 parts by mass, the total amount of the magnetic powder and the flame retardant increases relative to the binder. This makes difficult to keep binding the magnetic powder and the flame retardant together with the binder, the proportion of the magnetic powder in the magnetic sheet is decreased, causing decrease in the magnetic permeability.

The method for producing a magnetic sheet of the present invention is suitably selected from those known in the art depending on the intended purpose without any restriction, but the magnetic sheet is suitably produced by the following method.

<Production Method>

The method for producing a magnetic sheet contains at least applying the magnetic sheet composition on a substrate, drying the magnetic sheet composition applied on the substrate, and thermosetting the dried magnetic sheet composition, and may further contain other steps, if necessary.

—Magnetic Sheet Composition—

The magnetic sheet composition contains at least a binder, a magnetic powder, and a curing agent, and may further contain other components. In the magnetic sheet composition, the binder contains a thermosetting organic resin, and the curing agent contains a sulfonium borate complex expressed by General Formula 1.

Note that, the details of the binder, magnetic powder, curing agent, and other components are as mentioned above.

—Substrate—

The substrate is suitably selected depending on the intended purpose without any restriction, but it is preferably a polyester film a surface of which is lubrication processed (a release PET) as the formed magnetic layer can be easily peeled from the substrate.

—Coating—

A method for coating is suitably selected depending on the intended purpose without any restriction. Examples thereof include spin coating, dip coating, kneader coating, curtain coating, blade coating, and doctor blade coating. Of these, the blade coating, and the doctor blade coating are preferable, in terms of excellent coating efficiency.

—Drying—

A method for drying is suitably selected depending on the intended purpose without any restriction. Examples thereof include methods using a dry oven, a drier, a hot press, and a heating automation. Among them, the method using the dry oven is particularly preferable as the process thereof is easy, and it is advantageous in terms of the cost for the facilities.

—Thermosetting (Formation)—

A method of thermosetting (forming) the magnetic sheet is suitably selected depending on the intended purpose without any restriction. For example, the magnetic sheet can be formed by hot pressing.

A method of hot pressing is suitably selected depending on the intended purpose without any restriction. For example, both sides of a layer, which is formed by applying the magnetic composition onto the substrate, are sandwiched with press plates respectively via buffer materials, and heated and pressed.

The conditions for the hot pressing are suitably adjusted depending on the intended purpose without any restriction. For example, the temperature is preferably 80° C. to 190° C., the pressure is preferably 5 MPa to 20 MPa, and the duration is preferably 1 minute to 20 minutes.

The structure, thickness, and material of the buffer material are suitably selected depending on the indented purpose without any restriction.

The buffer material may be a commercially available product or arbitrarily prepared product. Examples of the commercially available product include a high quality paper (product name: OK Prince High Quality 70, manufacturer: Oji Paper Co., Ltd., Bekk smoothness: 6.2 sec/mL), a cushioned paper (product name: TF190, manufacturer: THE TOYO FIBRE CO., LTD., Bekk smoothness: 1.7 sec/mL), nylon mesh (product name: N-NO. 110S, manufacturer: TOKYO SCREEN CO., LTD., Bekk smoothness: less than 0.1 sec/mL), cotton cloth (product name: Kanakin No. 3, manufacturer: Japanese Standards Association, Bekk smoothness: less than 0.1 sec/mL), a base paper for an adhesive (product name: SO base paper 18G, manufacturer: DAIFUKU PAPER MFG CO., LTD., Bekk smoothness: less than 0.1 sec/mL), a double sided release paper (product name: 100GVW (High lubricity surfaces), manufacturer: Oji Paper Co., Ltd., Bekk smoothness: 146 sec/mL), and a double sided release paper (product name: 100GVW (Low lubricity surfaces), manufacturer: Oji Paper Co., Ltd., Bekk smoothness: 66 sec/mL).

Bekk smoothness expresses the time required for a certain amount of air to pass through the surface having some irregularities of a sheet member such as paper and a cloth. The larger the degree of the irregularities on the surface of the sheet member, the smaller the value of Bekk smoothness is, namely meaning excellent "lubricity".

Bekk smoothness is measured, for example, by Bekk Smoothness Tester (manufactured by TESTER SANGYO CO., LTD.).

As mentioned above, the magnetic sheet composition is applied onto the substrate, the applied magnetic sheet composition on the substrate is dried, and the dried magnetic sheet composition is thermoset, to thereby produce a magnetic sheet. Here, the magnetic sheet is obtained in such a state that the magnetic sheet is laminated on the substrate (release PET), but the magnetic sheet can be peeled from the substrate and used.

—Other Steps—

Other steps are suitably selected depending on the intended purpose without any restriction. Examples thereof include a pattern-transferring step.

—Pattern-Transferring Step—

The pattern transferring step is stacking a convex-concave forming layer and a pattern transferring material on a surface of the magnetic layer, which has been formed by thermosetting the magnetic sheet composition, in this order, and hot pressing the stacked layers so as to bond the convex-concave forming layer with the magnetic layer to form a stacked body, as well as to transfer a surface configuration of the pattern transferring material to a surface of the laminate of the convex-concave forming layer and the magnetic layer.

—Convex-Concave Forming Layer—

The structure, thickness, and material of the convex-concave forming layer are suitably selected depending on the intended purpose without any restriction. The details thereof are as mentioned earlier.

The surface configuration of the convex-concave forming layer is not particularly limited, and one surface thereof may be surface-treated, or no surface treatment may be performed. As a surface treatment, a matte processing, lubrication processing without using a silicone resin and the like are preferable. In the case a surface thereof is treated with any of the aforementioned processes, a lubricity of the surface is improved compared to the surface without any surface treatment. Moreover, in these processes of the surface treatment, as the silicone resin is not used, silicone oligomers do not bleed out under the condition of high temperature and/or high humidity, and thus it is suitably used inside of an electronic equipment.

The matte processing is suitably selected depending on the intended purpose without any restriction. Examples thereof include a sand matte processing, chemical matte processing, surface emboss processing and the like. By these processing, the convex-concave pattern is formed on the convex-concave forming layer and as a result, a lubricity thereof is improved.

The convex-concave forming layer preferably has Bekk smoothness of 200 sec/mL or less before hot pressing.

When Bekk smoothness thereof is more than 200 sec/mL before hot pressing, it adversely affects Bekk smoothness after hot pressing.

—Pattern-Transferring Material—

The structure, thickness and material of the pattern-transferring material are suitably selected depending on the intended purpose without any restriction. For example, those having a convex-concave pattern on the surface thereof and excellent air permeability are preferable. In this case, once the convex-concave pattern convex-concave forming layer on the surface of the pattern transferring material is transferred to the convex-concave forming layer, the convex-concave pattern is formed on the surface of the convex-concave forming layer, and as a result, Bekk smoothness of the convex-concave forming layer is lowered and lubricity of the convex-concave forming layer is improved.

The surface irregularities of the pattern transferring material can be evaluated by the value of Bekk smoothness. The smaller the value of Bekk smoothness is the larger the irregularities are.

The structure of the pattern transferring material may be a monolayered structure or laminate structure.

The thickness of the pattern transferring material is preferably 25 μm to 200 μm.

When the thickness thereof is less than 25 μm, it may not be able to attain a magnetic sheet of low Bekk smoothness. When the thickness thereof is more than 200 μm, heat does not easily transfer to the magnetic layer at the time of hot pressing, and thus the reliability may be lowered.

The material of the pattern transferring material is, for example, paper, synthetic fibers, or natural fibers.

The pattern-transferring material may be a commercially available product or arbitrarily prepared product. Examples of the commercially available product include a high quality paper (product name: OK Prince High Quality 70, manufacturer: Oji Paper Co., Ltd., Bekk smoothness: 6.2 sec/mL), a cushioned paper (product name: TF190, manufacturer: THE TOYO FIBER CO., LTD., Bekk smoothness: 1.7 sec/mL), nylon mesh (product name: N-NO. 110S, manufacturer: TOKYO SCREEN CO., LTD., Bekk smoothness: less than 0.1 sec/mL), cotton cloth (product name: Kanakin No. 3, manufacturer: Japanese Standards Association, Bekk smoothness: less than 0.1 sec/mL), a base paper for an adhesive (product name: SO base paper 18G, manufacturer: DAIFUKU PAPER MFG CO., LTD., Bekk smoothness: less than 0.1 sec/mL), a double sided release paper (product name: 100GVW (High lubricity surfaces), manufacturer: Oji Paper Co., Ltd., Bekk smoothness: 146 sec/mL), and a double sided release paper (product name: 100GVW (Low lubricity surfaces), manufacturer: Oji Paper Co., Ltd., Bekk smoothness: 66 sec/mL).

—Arrangement of Stacked Layers—

The method for an arrangement of stacked layers is suitably selected depending on the purpose without any restriction, provided that the convex-concave forming layer and the pattern transferring material are stacked on at least one surface of the magnetic layer in this order. It is preferred that a release layer and the pattern transferring material are further stacked on the other surface of the magnetic layer in this order. As the pattern transferring material are stacked on the other surface of the magnetic layer with the release layer being placed in between, the other surface of the magnetic layer is protected and prevented from closely attaching to the pattern transferring material at the time of hot pressing mentioned later, and the pattern transferring layer is easily peeled from the magnetic layer along with the release layer after hot pressing. Moreover, the surface configuration of the pattern transferring material is transfer to the surface of the magnetic layer which is present at the side of the releasing layer, and at this time, air bubbles present in the resin composition of the magnetic layer are easily released, and thus the reliability of the obtained magnetic sheet is improved. In the case where the pattern transferring material is not used at the side of the release layer, magnetic permeability of the magnetic sheet is improved.

The release layer is suitably selected depending on the intended purpose without any restriction, provided that it functions to prevent the close attachment between the other surface of the magnetic layer and the pattern transferring material at the time of hot pressing. The release layer is preferably a polyester film a surface of which is lubrication processed (lubrication processed PET), as it is easily peeled from the magnetic layer after hot pressing.

—Hot Press—

The method for hot pressing is suitably selected depending on the intended purpose without any restriction. For example, it is performed by sandwiching stacked layers of the magnetic layer, the convex-concave forming layer and the pattern transferring layer with a laminator or press the stacked layers from the both sides thereof, then heating and pressing the same.

As a result of hot pressing, the surface configuration (convex-concave pattern) of the pattern transferring material is transferred to surfaces of the convex-concave forming layer and magnetic layer, and also the convex-concave forming layer and the magnetic layer are directly bonded to each other without using an adhesive or the like.

The conditions for hot pressing are suitably adjusted depending on the intended purpose without any restriction. For example, the temperature is preferably 80° C. to 190° C., the pressure is preferably 5 MPa to 20 MPa, and the duration is preferably 1 minute to 20 minutes.

Bekk smoothness of the convex-concave forming layer after hot pressing is preferably 70 sec/mL or less, more preferably 1 sec/mL to 60 sec/mL.

When Bekk smoothness thereof is more than 70 sec/mL, the surface lubricity of the convex-concave forming layer may be insufficient, and as a result, the magnetic sheet and a member which is brought into contact with the magnetic sheet may be adhered.

According to the aforementioned step, the surface configuration of the pattern transferring material is transferred to the surfaces of the convex-concave forming layer and magnetic layer at the same time as the convex-concave forming layer and the magnetic layer are bonded to each other. As a result, a magnetic sheet containing the magnetic layer and the convex-concave forming layer is obtained.

The magnetic sheet obtained in the aforementioned manner has the convex-concave forming layer a surface of which has the surface configuration transferred from the surface configuration (convex-concave surface pattern) of the pattern transferring material and is roughened, and thus Bekk smoothness thereof is low and the lubricity thereof is excellent.

According to the method for producing the magnetic sheet of the present invention, a surface configuration of the pattern transferring material is transferred to surfaces of the convex-concave forming layer and magnetic layer by hot pressing, and thus a surface of the convex-concave forming layer is roughened, Bekk smoothness thereof is reduced, and the lubricity is improved.

Therefore, Bekk smoothness of the convex-concave forming layer can be suitably controlled in the desirable range regardless of the original value of Bekk smoothness of the convex-concave forming layer, and thus the selection of the material used for the convex-concave forming layer is widened. In addition, the control of Bekk smoothness can be performed easily.

Moreover, as the convex-concave forming layer and the magnetic layer are directly bonded to each other by hot pressing, an adhesive layer is unnecessary, and thus a magnetic sheet can be easily and efficiently produced at low cost.
(Magnetic Sheet)

The magnetic sheet is suitably selected depending on the intended purpose without any restriction, provided that it is produced by the method for producing a magnetic sheet mentioned earlier.
—Use—

The method for using the magnetic sheet of the present invention is suitably selected depending on the intended purpose without any restriction. For example, the magnetic sheet may be cut into a desirable size, and disposed in an electronic equipment so that the magnetic sheet is placed adjacent to a noise source of the electronic equipment.
—Application—

The magnetic sheet of the present invention can be suitably applied for electromagnetic noise depressors, electromagnetic wave absorbers, magnetic shielding, electronic equipments having IC tag functions such as Radio Frequency Identification (RFID), and non-contact IC cards. Particularly, the magnetic sheet can be suitably used for RFID functioned mobile phones.

EXAMPLES

Examples of the present invention will be explained hereinafter, but these examples shall not be construed as limiting the scope of the present invention.

Example 1

—Preparation of Curing Agent—
Sulfonium antimonate complexes respectively expressed by the formula 1d, 1e and 1f (see JP-A No. 10-245378 for synthesis methods thereof) were each made dissolved in ethyl acetate to prepare a 10% by mass ethyl acetate solution of each complex. A 10% solution of sodium borate expressed by the formula 3 (see JP-A No. 10-310587 for a synthesis method thereof) was prepared separately to above.

The 10% by mass solution of the sodium borate expressed by the formula 3 was mixed in the 10% by mass ethyl acetate solution of the complex in an equimolecular amount at room temperature, and the mixture was stirred for 30 minutes. Thereafter, the ethyl acetate layer was separated from the reacted mixed solution, and dried. The ethyl acetate was then removed under the reduced pressure. As a result, the sulfonium borate complex (4-hydroxyphenyl-methyl-1-naphthylmethyl sulfonium tetrakis(pentafluorophenyl) borate) expressed by the formula 1a, the sulfonium borate complex (4-hydroxyphenyl-methyl-(2-methylbenzyl)sulfonium tetrakis(pentafluorophenyl) borate) expressed by the formula 1b, and the sulfonium borate complex (4-hydroxyphenyl-methyl-benzylsulfonium tetrakis(pentafluorophenyl)borate) expressed by the formula 1c were each obtained as an evaporated residue.

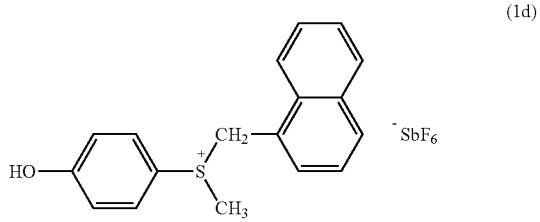

(1d)

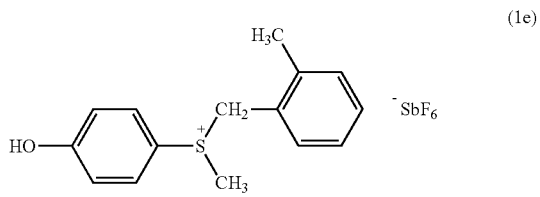

(1e)

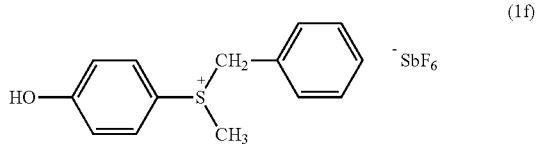

(1f)

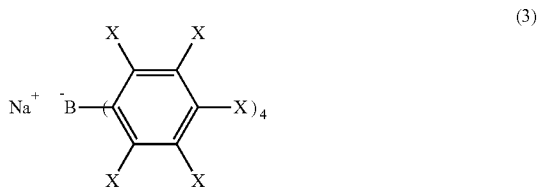

(3)

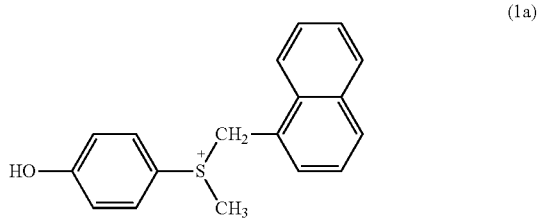

(1a)

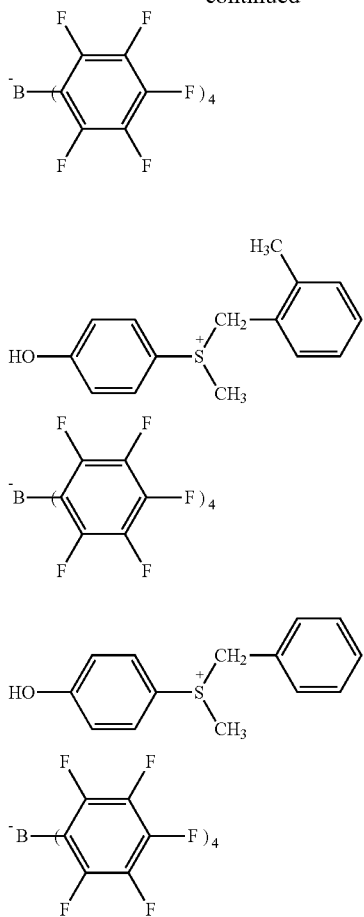

The sulfonium borate complexes 1a and 1b were each subjected to mass spectrometry (measuring device: AQUITY HPLC System, manufacturer: Nihon Waters K.K.), an elemental analysis (measuring device: PHOENIX, manufacturer: EDAX Inc.), an IR analysis (measuring device: 7000e FT-IR, manufacturer: Varian Technologies Japan Limited), and $^1$H-NMR analysis (measuring device: MERCURY PLUS, manufacturer: Varian Technologies Japan Limited). As a result, these complexes found to be targeted compounds.

Analysis Result of Sulfonium Borate Complex (4-hydroxyphenyl-methyl-1-naphthylmethyl sulfonium tetrakis(pentafluorophenyl) borate) of Formula 1a <Result of MS Analysis>

$M^+$=281 (sulfonium residue)

$M^+$=679 (borate residue)

<Result of Element Analysis>

Actual Value: C, 52.51; H, 1.89

Theoretical Value: C, 52.52; H, 1.78

<Result of IR Analysis (cm$^{-1}$)>

662 (C—S), 776, 980, 1088, 1276 (Ar—F), 1300, 1374, 1464, 1514, 1583, 1643, 2881 (C—H), 2981 (C—H), 3107 (O—H)

<Result of $^1$H-NMR Analysis (δ), see FIG. 1 (using THF)>

2.6 (1H, (d)), 3.3 (3H, (a)), 5.3 (2H, (e)), 6.9 (2H, (c)), 7.6 (2H, (b)), 7.2 to 8.1 (7H, (f), (g), (h), (i), (j), (k), (l))<

<Assignment of Proton>

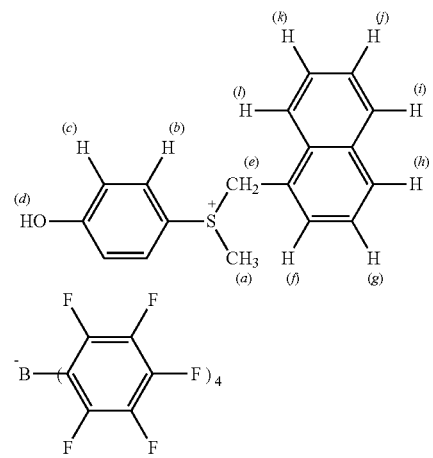

Analysis Result of Sulfonium Borate Complex (4-hydroxyphenyl-methyl-(2-methylbenzyl)sulfonium tetrakis(pentafluorophenyl) borate) of Formula 1b <Result of MS Analysis>

$M^+$=245 (sulfonium residue)

$M^+$=679 (borate residue)

<Result of Element Analysis>

Actual Value: C, 50.39; H, 1.77

Theoretical Value: C, 50.60; H, 1.80

<Result of IR Analysis (cm$^{-1}$)>

662 (C—S), 773, 980, 1088, 1276 (Ar—F), 1463, 1514, 1583, 1644, 2882 (C—H), 2983 (C—H), 3109 (O—H)

Figure 2:
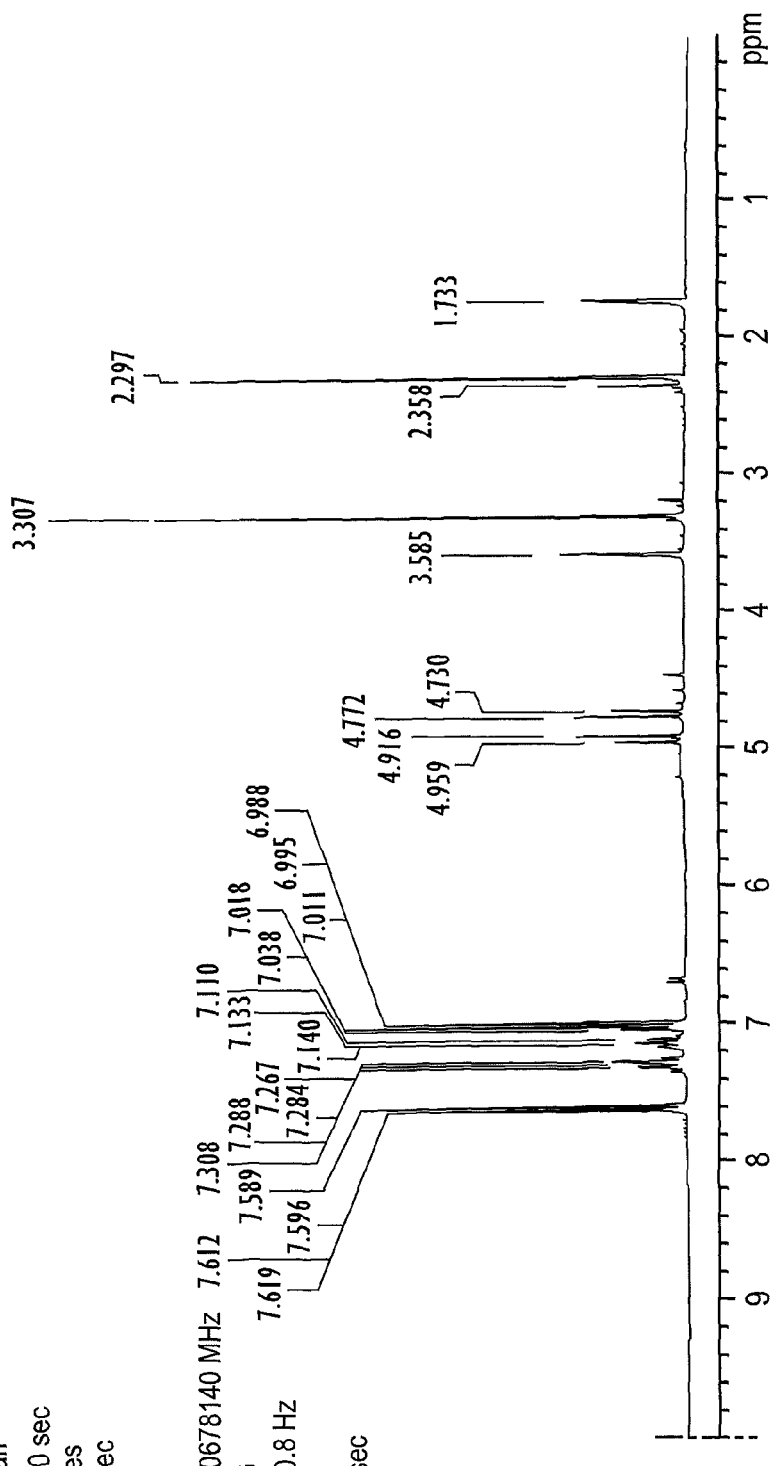
FIG. 2 is a $^1$H-NMR chart of the sulfonium borate complex expressed by the formula 1b.

<Result of $^1$H-NMR Analysis (δ), see FIG. 2 (Using THF)>

2.3 (3H, (j)), 2.4 (1H, (d)), 3.3 (3H, (a)), 4.8 (2H, (e)), 7.0 (2H, (c)), 7.6 (2H, (b)), 7.0 to 7.4 (4H, (f), (g), (h), (i))

—Evaluation of Properties—

The sulfonium borate complexes 1a to 1c and sulfonium antimonate complexes 1d to 1f were each subjected to the measurement of the fluorine-ion concentration under the same temperature condition to that of thermal cationic polymerization in the manner described below. Moreover, a thermal cationic polymerization composition was prepared using each complex, and the prepared composition was subjected to a differential thermal analysis (DSC) at the temperature rising rate of 10° C./min.

—Measurement of Fluorine Ion Concentration—

To 10 mL of pure water, 0.2 g of each complex was added, and the mixture was heated at 100° C. for 10 hours. Then, an amount of fluorine ions contained in the supernatant was measured by an ion chromatography system (manufactured by Dionex Corporation). The results are shown in Table 1. It is preferred that the result be less than 10 ppm for the practical use.

—DSC—

In 100 parts by mass of a fluid epoxy resin (Epikote 828, manufactured by Japan Epoxy Resins Co., Ltd.) the complexes of Examples 1 and 2, and Comparative Examples 1 to 4 were each mixed to prepare a thermal cationic polymerization composition. Here, the complexes of Examples 1 and 2 were each mixed in an amount of 1 part by mass, the complex of Comparative Example 1 was mixed in an amount of 3 parts by mass, and the complexes of Comparative Examples 2 to 4 were each mixed in an amount of 5 parts by mass. Each thermal cationic polymerization composition was subjected to a differential thermal analysis (heating onset temperature, peak temperature, calorific value) by means of a thermal analysis equipment (DSC 5100, manufactured by Seiko Instruments Inc.). The results are shown in Table 1.

Note that, the heating onset temperature is temperature at which protons are generated from the complex to initiate cationic polymerization. The low-temperature curing ability is more enhanced as the heat onset temperature is lower. However, in this case, the storage stability tends to decrease. Therefore, it is preferably 80° C. to 110° C. Moreover, when the thermal peak temperature is excessively low, the storage stability reduced. When it is excessively high, curing failures tend to occur. Therefore, the thermal peak temperature is preferably 100° C. to 140° C. The calorific value is corresponded to heat of the reaction, and is preferably 200 J/g or larger as curing failures tend to occur with the excessively small calorific value.

TABLE 1

| Complex | F-ion concentration (ppm) | Reaction onset temperature (° C.) | Exothermic peak temperature (° C.) | Calorific value (J/g) |
|---|---|---|---|---|
| 1a | 2.1 | 85 | 114 | 250 |
| 1b | 2.3 | 105 | 134 | 320 |
| 1c | 2.3 | 115 | 147 | 270 |
| 1d | 160,000 | 83 | 118 | 290 |
| 1e | 170,000 | 106 | 135 | 300 |
| 1f | 172,000 | 116 | 146 | 280 |

—Preparation of Magnetic Sheet—

At first, in a mixture of 270 parts by mass of toluene and 120 parts by mass of ethyl acetate, 83 parts by mass of acrylic rubber having epoxy groups (SG80H-3, manufactured by Nagase ChemteX Corporation, a number average molecular mass of 150,000, a mass average molecular mass of 350,000) serving as a binder, 23.1 parts by mass of an epoxy resin (Epikote 1031S, manufactured by Japan Epoxy Resins Co., Ltd.) serving as a binder, and 6.9 parts by mass of a cationic curing agent A (4-hydroxyphenyl-methyl-1-naphthylsulfoniumtetrakis(pentafluorophenyl) borate; Formula 1a) serving as a curing agent were made dissolved to prepare a resin composition. To the resin composition, 550 parts by mass of a flat magnetic powder (JEM-S, manufactured by Mitsubishi Materials Corporation) serving as a magnetic powder was added, and mixed to prepare a magnetic sheet composition.

Next, the obtained magnetic sheet composition was applied onto a polyester film a surface of which had been lubricated processed (a release PET) (38GS manufactured by Lintec Corporation, thickness of 38 μm) as a substrate using a bar coater (i.e., the magnetic sheet composition was applied on the surface which had been lubricated processed), to form a layer having a thickness of 100 μm to 200 μm.

Next, the applied coat was dried at room temperature for 10 minutes, and then dried at 60° C. for 10 minutes. The release PET on the lubrication-processed surface of which a layer formed of the magnetic sheet composition (a magnetic layer) had been formed was cut into the size of 250 mm×250 mm, to thereby obtain 4 pieces of the release PET on the lubrication-processed surface of which the magnetic layer had been formed in the size of 250 mm×250 mm. Regarding two pieces of the release PET on the lubrication-processed surface of which the magnetic layer in the size of 250 mm×250 mm had been formed, the release PET was removed from the magnetic layer, to thereby obtain two pieces of the 250 mm×250 mm magnetic layer. The two magnetic layers (each in the size of 250 mm×250 mm) were placed and stacked on the magnetic layer side of the release PET on the lubrication-processed surface of which the magnetic sheet in the size of 250 mm×250 mm had been formed. Moreover, to the side of the lubrication-processed surface of this release PET, one piece of the release PET on the lubrication-processed surface of which the magnetic layer in the size of 250 mm×250 mm had been formed was placed and stacked (so that the magnetic layers were facing each other), to thereby obtain a release PET in which four magnetic layers were stacked and both surfaces of the stacked layers were both held with a pair of the release PETs (i.e. the lubrication-processed surfaces of the two release PET were arranged so as to be in contact with the magnetic layers).

Next, on both surfaces of the stacked layers, which consisted of the release PET, and the four magnetic layers stacked on another release PET, two pieces of high quality paper (product name: OK Prince High Quality 70, manufacturer: Oji Paper Co., Ltd., thickness: 100 μm, Bekk smoothness: 6.2 sec/mL) used as buffer materials were respectively stacked. Then, the stacked buffer materials were hot-pressed by means of press plates using a vacuum press (manufactured by KITAGAWA SEIKI Co., Ltd.) under the conditions of the press-retaining temperature of 170° C., press-retaining duration (i.e. the time-period during which the press-retaining temperature was maintained) of 5 minutes, press duration (i.e., the time required to come drown to 90° C. after reaching the press-retaining temperature from 90° C.) of 38 minutes, and press-pressure of 9 MPa. Thereafter, the two release PET were removed from the magnetic layer formed by curing the laminated four magnetic layers, to thereby obtain a magnetic sheet.

Examples 2 to 7

—Preparation of Magnetic Sheet—

Magnetic sheets of Examples 2 to 7 were each prepared in the same manner as in Example 1, provided that at least one of the formulated amount of the cationic curing agent A, the press retaining temperature, and the press retaining duration were changed as presented in Table 2.

Example 8

—Preparation of Magnetic Sheet—

A magnetic sheet of Example 8 was prepared in the same manner as in Example 1, provided that as the curing agent, a cationic curing agent C (4-hydroxyphenyl-methyl-benzyl sulfonium tetrakis(pentafluorophenyl) borate; the formula (1c)) was used instead of the cationic curing agent A (4-hydroxyphenyl-methyl-1-naphthylmethyl sulfonium tetrakis(pentafluorophenyl) borate; the formula (1a)).

Examples 9 and 10

—Preparation of Magnetic Sheet—

Magnetic sheets of Examples 9 and 10 were each prepared in the same manner as in Example 8, provided that at least one of the formulated amount of the cationic curing agent C, the press-retaining temperature, and the press-duration were changed as presented in Table 3.

Example 11

—Preparation of Magnetic Sheet—

A magnetic sheet of Example 11 was prepared in the same manner as in Example 2, provided that as the curing agent, the cationic curing agent B (4-hydroxyphenyl-methyl-(2-methylbenzyl) sulfonium tetrakis(pentafluorophenyl) borate; the formula (1b)) was used instead of the cationic curing agent A (4-hydroxyphenyl-methyl-1-naphthyl sulfonium tetrakis (pentafluorophenyl) borate; the formula (1a)).

Example 12

—Preparation of Magnetic Sheet—

A magnetic sheet of Example 12 was prepared in the same manner as in Example 2, provided that as the magnetic powder, a flat magnetic powder (SP-1, manufactured by MATE CO., LTD.) was used instead of the flat magnetic powder (JEM-S, manufactured by Mitsubishi Materials Corporation).

Example 13

—Preparation of Magnetic Sheet—

A magnetic sheet of Example 13 was prepared in the same manner as in Example 1, provided that as the magnetic powder, a flat magnetic powder (SP-1, manufactured by MATE CO., LTD.) was used instead of the flat magnetic powder (JEM-S, manufactured by Mitsubishi Materials Corporation).

Example 14

—Preparation of Magnetic Sheet—

A magnetic sheet of Example 14 was prepared in the same manner as in Example 1, provided that as the magnetic powder, 900 parts by mass of a flat magnetic powder (EMS10, manufactured by Mitsubishi Materials Corporation) was used instead of 550 parts by mass of the flat magnetic powder (JEM-S, manufactured by Mitsubishi Materials Corporation), and the formulated amount of the cationic curing agent A was changed from 6.9 parts by mass to 8 parts by mass.

Example 15

—Preparation of Magnetic Sheet—

A magnetic sheet of Example 15 was prepared in the same manner as in Example 1, provided that the formulated amount of the flat magnetic powder (JEM-S, manufactured by Mitsubishi Materials Corporation) was changed from 550 parts by mass to 1,600 parts by mass, the formulated amount of the cationic curing agent A was changed from 6.9 parts by mass to 10 parts by mass, and a convex-concave forming layer and a pattern-transferring material were stacked in this order on one plane of the magnetic layer, which had bee formed by thermosetting the magnetic sheet composition, followed by hot-pressing to transfer the pattern.

—Pattern Transferring—

A matte-surface treated polyester film (matte-processed PET) (product name: LUMIRRORX44-#25, manufacturer: Toray Industries, Inc., thickness: 25 µm, Bekk smoothness: 101.8 sec/mL) serving as a convex-concave forming layer, and a high quality paper (product name: OK Prince High Quality 70, manufacturer: Oji Paper Co., Ltd., thickness: 100 µm, Bekk smoothness: 6.2 sec/mL) serving as a pattern transferring material were stacked on a surface of the magnetic layer so that the convex-concave forming layer and the pattern transferring material were stacked in this order from the side of the magnetic layer.

Moreover, on the other surface of the magnetic layer, a surface-lubrication-processed polyester film (manufactured by Lintec Corporation) serving as a release layer, and a high quality paper (product name: OK Prince High Quality 70, manufacturer: Oji Paper Co., Ltd., thickness: 100 µm, Bekk smoothness: 6.2 sec/mL) serving as a pattern transferring material were stacked, to thereby form a stacked body.

Thereafter, the stacked body was subjected to hot pressing using a vacuum press (manufactured by KITAGAWA SEIKI CO., LTD.) at temperature of 170° C., and pressure of 9 MPa, for 10 minutes, by sandwiching the stacked body from both sides thereof with press plates to form the magnetic layer having a thickness of 80 µm. As a result, the convex-concave forming layer and the magnetic layer were bonded, and at the same time, the surface configuration of the pattern transferring material was transferred to a surface of the laminate of the convex-concave forming layer and the magnetic layer. The processes mentioned above were corresponded to the pattern transferring step.

The laminate, which had been hot-pressed, was cut into a sample size of 250 mm×250 mm.

Then, the pattern transferring material and the release layer were released from the convex-concave forming layer and the magnetic layer to thereby obtain a magnetic sheet having a thickness of 105 µm.

Note that, the Bekk smoothness thereof after the hot-pressing was 26.3 sec./mL.

Example 16

—Preparation of Magnetic Sheet—

A magnetic sheet of Example 16 was prepared in the same manner as in Example 1, provided that the formulated amount of the flat magnetic powder (JEM-S, manufactured by Mitsubishi Materials Corporation) as the magnetic powder was changed from 550 parts by mass to 1,200 parts by mass, the formulated amount of the cationic curing agent A was changed from 6.9 parts by mass to 10 parts by mass, and 10 parts by mass of red phosphorous (manufactured by Rinkagaku Kogyo Co., Ltd.) and 90 parts by mass of carboxylic acid amide-containing melamine cyanurate (MC-5F, manufactured by Sakai Chemical Industry Co., Ltd.) were further added.

Example 17

—Preparation of Magnetic Sheet—

A magnetic sheet of Example 17 was prepared in the same manner as in Example 1, provided that as the magnetic powder, 900 parts by mass of a flat magnetic powder (EMS10, manufactured by Mitsubishi Materials Corporation) was used instead of 550 parts by mass of the flat magnetic powder (JEM-S, manufactured by Mitsubishi Materials Corporation), the formulated amount of the cationic curing agent A was changed from 6.9 parts by mass to 8 parts by mass, and 10 parts by mass of red phosphorous (manufactured by Rinkagaku Kogyo Co., Ltd.) and 90 parts by mass of carboxylic acid amide-containing melamine cyanurate (MC-5F, manufactured by Sakai Chemical Industry Co., Ltd.) were further added.

Comparative Example 1

—Preparation of Magnetic Sheet—

A magnetic sheet of Comparative Example 1 was prepared in the same manner as in Example 1, provided that as the curing agent, an imidazole-based curing agent (HX3748, manufactured by Asahi Kasei Chemicals Corporation) was used instead of the cationic curing agent A (4-hydroxyphenyl-methyl-1-naphthyl sulfonium tetrakis(pentafluorophenyl) borate; the formula (1a)).

Comparative Example 2

—Preparation of Magnetic Sheet—

A magnetic sheet of Comparative Example 2 was prepared in the same manner as in Example 2, provided that as the curing agent, an imidazole-based curing agent (HX3748, manufactured by Asahi Kasei Chemicals Corporation) was used instead of the cationic curing agent A (4-hydroxyphenyl-methyl-1-naphthyl sulfonium tetrakis(pentafluorophenyl) borate; the formula (1a)).

Comparative Example 3

—Preparation of Magnetic Sheet—

A magnetic sheet of Comparative Example 3 was prepared in the same manner as in Example 3, provided that as the curing agent, an imidazole-based curing agent (HX3748, manufactured by Asahi Kasei Chemicals Corporation) was used instead of the cationic curing agent A (4-hydroxyphenyl-methyl-1-naphthyl sulfonium tetrakis(pentafluorophenyl) borate; the formula (1a)).

Comparative Example 4

—Preparation of Magnetic Sheet—

A magnetic sheet of Comparative Example 4 was prepared in the same manner as in Example 4, provided that as the curing agent, an imidazole-based curing agent (HX3748, manufactured by Asahi Kasei Chemicals Corporation) was used instead of the cationic curing agent A (4-hydroxyphenyl-methyl-1-naphthyl sulfonium tetrakis(pentafluorophenyl) borate; the formula (1a)).

Comparative Example 5

—Preparation of Magnetic Sheet—

A magnetic sheet of Comparative Example 5 was prepared in the same manner as in Example 5, provided that as the curing agent, an imidazole-based curing agent (HX3748, manufactured by Asahi Kasei Chemicals Corporation) was used instead of the cationic curing agent A (4-hydroxyphenyl-methyl-1-naphthyl sulfonium tetrakis(pentafluorophenyl) borate; the formula (1a)).

Comparative Example 6

—Preparation of Magnetic Sheet—

A magnetic sheet of Comparative Example 6 was prepared in the same manner as in Example 6, provided that as the curing agent, an imidazole-based curing agent (HX3748, manufactured by Asahi Kasei Chemicals Corporation) was used instead of the cationic curing agent A (4-hydroxyphenyl-methyl-1-naphthyl sulfonium tetrakis(pentafluorophenyl) borate; the formula (1a)).

Comparative Example 7

—Preparation of Magnetic Sheet—

A magnetic sheet of Comparative Example 7 was prepared in the same manner as in Comparative Example 1, provided that the press-retaining duration and the press duration were both changed as presented in Table 6.

Comparative Example 8

—Preparation of Magnetic Sheet—

A magnetic sheet of Comparative Example 8 was prepared in the same manner as in Example 1, provided that as the curing agent, an antimony-based cationic curing agent (San-Aid SI-60L, manufactured by Sanshin Chemical Industry Co., Ltd.) was used instead of the cationic curing agent A (4-hydroxyphenyl-methyl-1-naphthyl sulfonium tetrakis(pentafluorophenyl) borate; the formula (1a)).

[Magnetic Permeability]

At first, a ring sample, which had been cut out so as to have an outer diameter of 7.05 mm, and an inner diameter of 2.945 mm, was prepared. A lead-wire was then wound around the ring sample 5 times, and then it was soldered to a terminal. Here, the length between the bottom of the terminal and bottom of the ring sample was set 20 mm. Then, the inductance and resistance thereof at 1 MHz were measured using an impedance analyzer (4294A, manufactured by Agilent Technologies, Inc.), and the obtained values were converted into magnetic permeability.

Note that, $\mu'$ denotes a real part of complex magnetic permeability.

The properties of $\mu'$ are different depending on the intended use of a magnetic sheet. For example, in the case where it is used for improving a correspondence of a RFID device, it is preferred that the value of $\mu'$ is high and the value of $\mu''$ (an imaginary part of complex magnetic permeability) is low at the frequency of 20 MHz or lower.

Moreover, the magnetic sheet of the present invention is usable in the frequency range of KHz to GHz.

[Reliability Test]

—Change in Thickness—

At first, a thickness of the magnetic sheet was measured. Then, the magnetic sheet was placed in an oven, and heated at 85° C., and 60% RH for 96 hours. After taking the magnetic sheet out from the oven, the thickness of the magnetic sheet was measured again, and a rate of the change in the thickness of the magnetic sheet before and after heating was measured.

[Fluorine ($F^{-1}$) Ion Elution Test]

A magnetic sheet sample (about 0.2 g) of Example 1 and a magnetic sheet sample (about 0.2 g) of Comparative Example 8 were each separately added to a PP container having 10 mL of ultrapure water. The container was then placed in an oven set at 100° C., and was left there for 10 hours. Thereafter, 10 mL of an extract was taken out from the container, and was subjected to the measurement of a fluorine ($F^{-1}$) ion concentration (μg/mL). Based on the obtained fluorine ($F^{-1}$) ion concentration (μg/mL) of the extract, a fluorine ($F^{-1}$) ion concentration (μg/g) per g of the magnetic sheet sample was calculated using the following formula (1). The results are shown in Table 7.

(Fluorine ($F^{-1}$) ion concentration (μg/mL)−blank average value (μg/mL))×10 (mL)/(weight of magnetic sheet sample (g))  <Formula (1)>

[Corrosion Test]

Figure 3A:
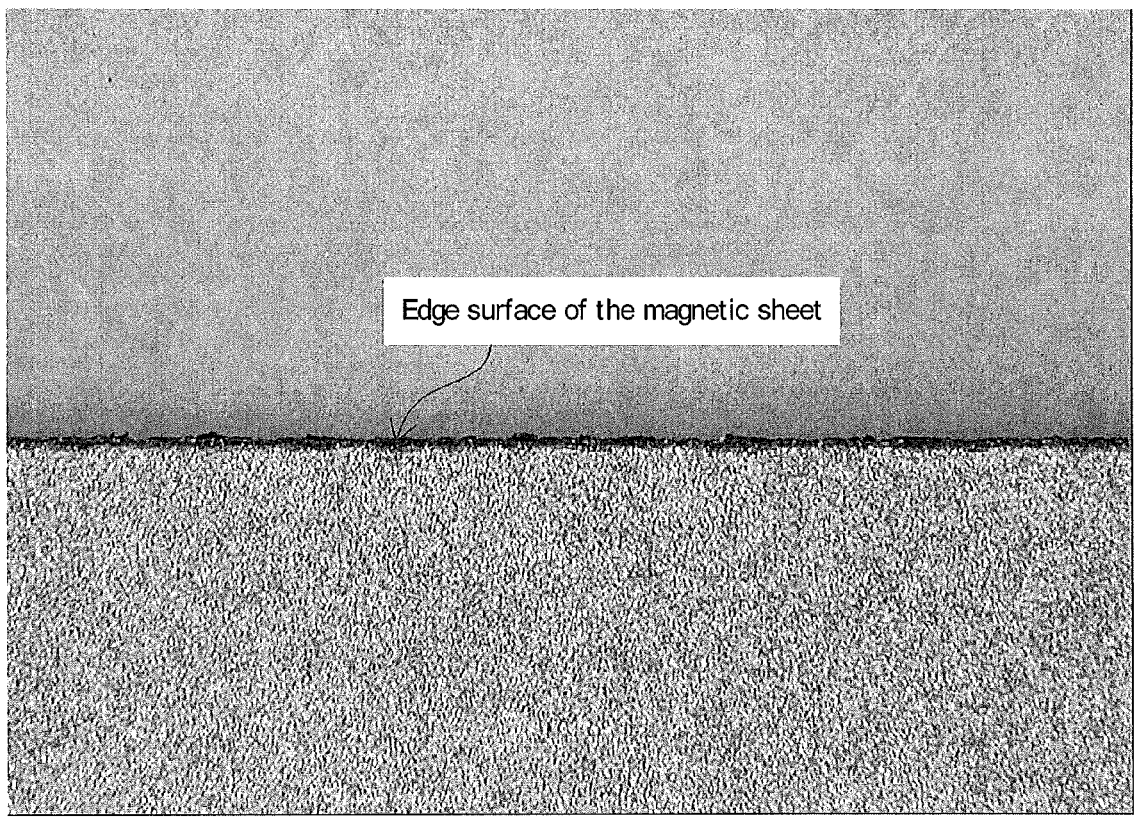
FIG. 3A is a photograph showing a cross-section of the magnetic sheet sample (Example 1) after the corrosion test.
Figure 3B:
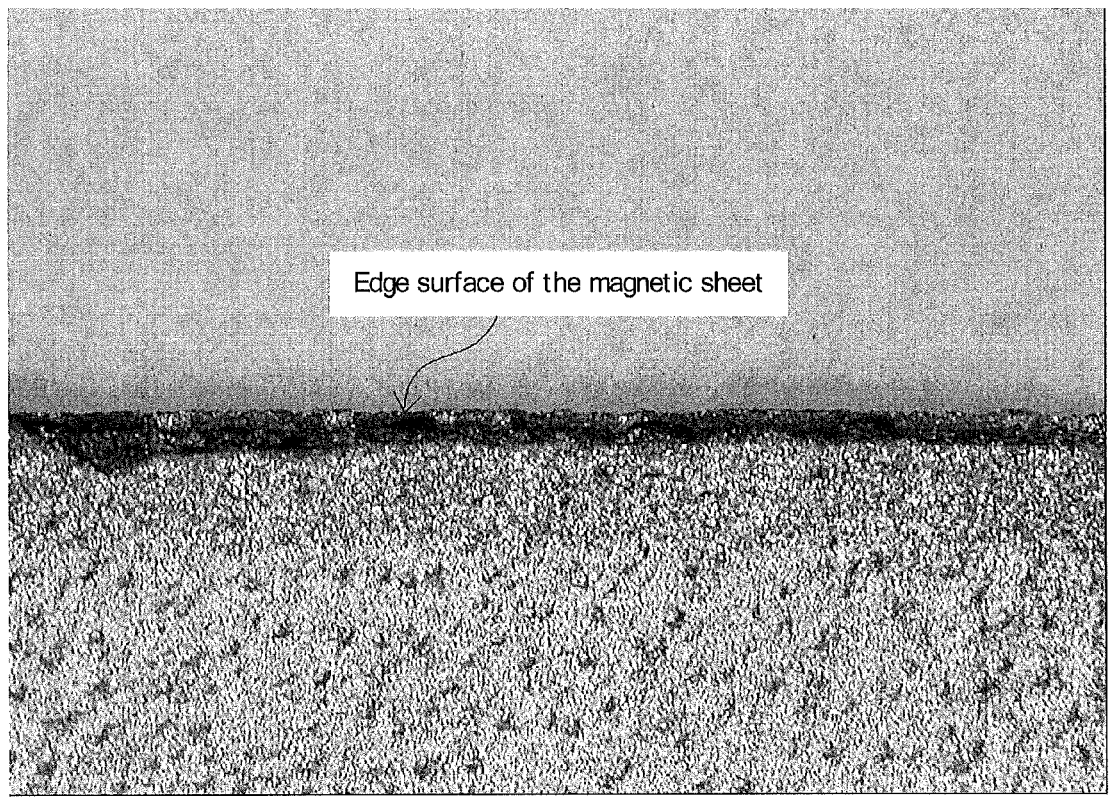
FIG. 3B is a photograph showing a cross-section of the magnetic sheet sample (Comparative Example 8) after the corrosion test.

A magnetic sheet sample (about 0.2 g) of Example 1 and a magnetic sheet sample (about 0.2 g) of Comparative Example 8 were each separately added to a plastic container (DES-CUP) containing 50 mL of tap water. Then, the container was placed in an oven set at 85° C. and 85% RH, and was left there for 16 hours. Thereafter, the magnetic sheet sample was taken out from the plastic container containing 50 mL of tap water, and the cross-sectional plane of the magnetic sheet was observed under a microscope. The results are shown in FIGS. 3A and 3B, and Table 7.

[Combustion Test]

Magnetic sheet samples of Example 16 and Example 17 were both subjected to the combustion test in the following manner.

As the combustion test, a UL94V test (a combustion test for a plastic material of machinery parts) was carried out. The UL94V test was a method for evaluating flame resistance based on the afterflame time, after placing a certain size of a sample directly in a flame of a burner for 10 seconds with the sample held vertically. The results were evaluated based on the following criteria.

—Evaluation Criteria—

V-0: The afterflame time of each sample was 10 seconds or shorter, and the total afterflame time of 5 samples was 50 seconds or shorter.

V-1: The afterflame time of each sample was 30 seconds or shorter but longer than 10 seconds, and the total afterflame time of 5 samples was 250 seconds or shorter but longer than 50 seconds.

V-2: The combustion time (afterflame time) was the same as V-1, but there were flame-droppings.

NG: The flame resistance was low, and it did not comply with the standard of UL94V.

Here, "afterflame time" means a length of time showing how long flame combustion of the test sample continues after an ignition source is moved away.

[Method of Measuring LOSS Properties (Transmission Loss)]

Magnetic sheets of Examples 16 and 17 were each subjected to the measurement of LOSS properties (transmission loss) in the following manner.

Figure 4:
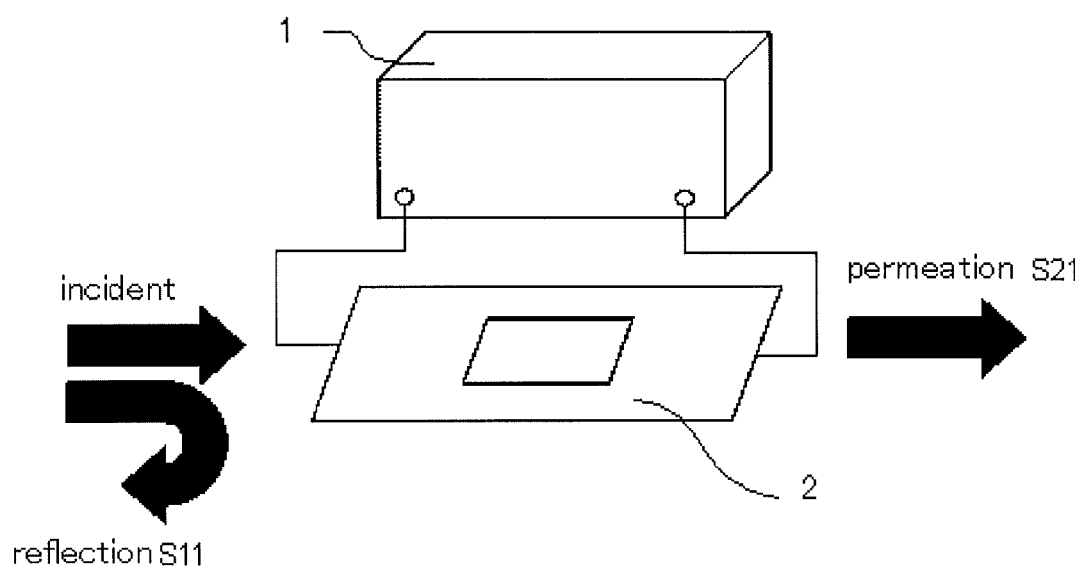
FIG. 4 is a diagram for explaining the method for measuring the transmission loss.

For measurement of transmission loss, a microstripline having an impedance Z of 50Ω was used. The use of the microstripline line was a commonly used method for measuring transmission loss of adjacent noise, because of its structure suitable for mounting a surface-mounting component and production easiness. The shape of the microstripline 2 used is shown in FIG. 4. The transmission loss was measured in such a manner that a linear conductor path was provided on a surface of an insulator substrate, and a magnetic sheet was placed on the conductor path for measurement. Both ends of the conductor path were connected to a network analyzer 1. Then, a reflection amount (dB) and a permeation amount (dB) from the part where an electromagnetic wave absorption material was mounted, was measured with respect to incident wave shown by an arrow, and the difference between the reflection amount (dB) and the permeation amount (dB) was obtained as a loss amount, and thus a transmission loss (absorptance) was obtained (incident amount=reflection S11+loss+permeation S21). Specifically, a known amount of an electromagnetic wave was incident, the reflection amount S11 and the permeation amount S21 were measured, and then calculated to obtain a loss amount.

The thicker the magnetic sheet was, the higher the transmission loss of the microstripline became. Generally, a magnetic sheet having a thin thickness and high transmission loss is desired.

TABLE 2

| | | Ex. 1 | Ex. 2 | Ex. 3 | Ex. 4 | Ex. 5 | Ex. 6 | Ex. 7 |
|---|---|---|---|---|---|---|---|---|
| Magnetic powder (mass part) | Flat magnetic powder (JEM-S) | 550 | 550 | 550 | 550 | 550 | 550 | 550 |
| Binder (mass part) | Acrylic rubber (SG80H-3) | 83 | 83 | 83 | 83 | 83 | 83 | 83 |
| | Epoxy resin (1031S) | 23.1 | 23.1 | 23.1 | 23.1 | 23.1 | 23.1 | 23.1 |
| Curing agent | Cationic curing agent A | 6.9 | 6.9 | 6.9 | 4.0 | 4.0 | 2.0 | 2.0 |
| Hot press | Press-retaining temperature (° C.) | 170 | 150 | 130 | 170 | 150 | 170 | 150 |
| | Press-retaining duration (min.) | 5 | 5 | 5 | 5 | 5 | 5 | 5 |
| | Press duration (min.) | 38 | 20 | 16 | 38 | 20 | 38 | 20 |
| Magnetic permeability | Initial magnetic permeability μ' (1 MHz) | 40.4 | 38.9 | 38.2 | 41.0 | 40.2 | 40.9 | 40.1 |
| Reliability test | Thickness before test (μm) | 293 | 321 | 322 | 297 | 299 | 300 | 301 |
| | Thickness after test (μm) | 294 | 325 | 330 | 300 | 303 | 305 | 307 |
| | Thickness changing rate (%) | 0.34 | 1.25 | 2.48 | 1.01 | 1.34 | 1.67 | 1.99 |

TABLE 3

|  |  | Ex. 8 | Ex. 9 | Ex. 10 | Ex. 11 | Ex. 12 | Ex. 13 |
|---|---|---|---|---|---|---|---|
| Magnetic powder (mass part) | Flat magnetic powder (JEM-S) | 550 | 550 | 550 | 550 | NA | NA |
|  | Flat magnetic powder (SP-1) | NA | NA | NA | NA | 550 | 550 |
| Binder (mass part) | Acrylic rubber (SG80H-3) | 83 | 83 | 83 | 83 | 83 | 83 |
|  | Epoxy resin (1031S) | 23.1 | 23.1 | 23.1 | 23.1 | 23.1 | 23.1 |
| Curing agent | Cationic curing agent A | NA | NA | NA | NA | 6.9 | 6.9 |
|  | Cationic curing agent B | NA | NA | NA | 6.9 | NA | NA |
|  | Cationic curing agent C | 6.9 | 6.9 | 10.0 | NA | NA | NA |
| Hot press | Press-retaining temperature (° C.) | 170 | 150 | 150 | 150 | 150 | 170 |
|  | Press-retaining duration (min.) | 5 | 5 | 5 | 5 | 5 | 5 |
|  | Press duration (min.) | 38 | 20 | 20 | 20 | 20 | 38 |
| Magnetic permeability | Initial magnetic permeability μ' (1 MHz) | 42.0 | 41.3 | 38.9 | 42.0 | 101.5 | 103.3 |
| Reliability test | Thickness before test (μm) | 295 | 300 | 308 | 298 | 291 | 287 |
|  | Thickness after test (μm) | 296 | 304 | 309 | 302 | 296 | 290 |
|  | Thickness changing rate (%) | 0.34 | 1.33 | 0.32 | 1.34 | 1.72 | 1.05 |

TABLE 4

|  |  | Ex. 14 | Ex. 15 | Ex. 16 | Ex. 17 |
|---|---|---|---|---|---|
| Magnetic powder (mass part) | Flat magnetic powder (EMS10) | 900 | NA | NA | 900 |
|  | Flat magnetic powder (JEM-S) | NA | 1,600 | 1,200 | NA |
| Binder (mass part) | Acrylic rubber (SG80H-3) | 83 | 83 | 83 | 83 |
|  | Epoxy resin (1031S) | 23.1 | 23.1 | 23.1 | 23.1 |
| Curing agent | Cationic curing agent A | 8 | 10 | 10 | 8 |
| Red phosphorus | Red phosphorus | NA | NA | 10 | 10 |
| Carboxylic acid amide-containing melamine cyanurate | MC-5F | NA | NA | 90 | 90 |
| Hot press | Press-retaining temperature (° C.) | 170 | 170 | 170 | 170 |
|  | Press-retaining duration (min.) | 5 | 5 | 5 | 5 |
|  | Press duration (min.) | 38 | 38 | 38 | 38 |
| Magnetic permeability | Initial magnetic permeability μ' (1 MHz) | 115.1 | 46.2 | 41.3 | 93.4 |
| Reliability test | Thickness before test (μm) | 99 | 105 | 99 | 108 |
|  | Thickness after test (μm) | 100 | 107 | 100 | 109 |
|  | Thickness changing rate (%) | 1.01 | 1.90 | 1.01 | 0.93 |
| Combustion test result |  | NA | NA | V-0 | V-0 |

TABLE 5

|  |  | Comp. Ex. 1 | Comp. Ex. 2 | Comp. Ex. 3 | Comp. Ex. 4 |
|---|---|---|---|---|---|
| Magnetic powder (mass part) | Flat magnetic powder (JEM-S) | 550 | 550 | 550 | 550 |
| Binder (mass part) | Acrylic rubber (SG80H-3) | 83 | 83 | 83 | 83 |
|  | Epoxy resin (1031S) | 23.1 | 23.1 | 23.1 | 23.1 |
| Curing agent | Imidazole-based curing agent (HX3748) | 6.9 | 6.9 | 6.9 | 4.0 |
| Hot press | Press-retaining temperature (° C.) | 170 | 150 | 130 | 170 |
|  | Press-retaining duration (min.) | 5 | 5 | 5 | 5 |
|  | Press duration (min.) | 38 | 20 | 16 | 38 |
| Magnetic permeability | Initial magnetic permeability μ' (1 MHz) | 40.5 | 39.9 | 38.9 | 34.6 |
| Reliability test | Thickness before test (μm) | 278 | 283 | 294 | 336 |
|  | Thickness after test (μm) | 284 | 293 | 308 | 347 |
|  | Thickness changing rate (%) | 2.16 | 3.53 | 4.76 | 3.27 |

TABLE 6

|  |  | Comp. Ex. 5 | Comp. Ex. 6 | Comp. Ex. 7 | Comp. Ex. 8 |
|---|---|---|---|---|---|
| Magnetic powder (mass part) | Flat magnetic powder (JEM-S) | 550 | 550 | 550 | 550 |
| Binder (mass part) | Acrylic rubber (SG80H-3) | 83 | 83 | 83 | 83 |
|  | Epoxy resin (1031S) | 23.1 | 23.1 | 23.1 | 23.1 |
| Curing agent | Imidazole-based curing agent (HX3748) | 4.0 | 2.0 | 6.9 | NA |
|  | Antimony-based curing agent (San-Aid SI-60L) | NA | NA | NA | 6.9 |
| Hot press | Press-retaining temperature (° C.) | 150 | 170 | 170 | 170 |
|  | Press-retaining duration (min.) | 5 | 5 | 10 | 5 |
|  | Press duration (min.) | 20 | 38 | 43 | 38 |
| Magnetic permeability | Initial magnetic permeability μ' (1 MHz) | 32.3 | 33.0 | 41.0 | 40.8 |
| Reliability test | Thickness before test (μm) | 341 | 340 | 282 | 303 |
|  | Thickness after test (μm) | 359 | 406 | 286 | 307 |
|  | Thickness changing rate (%) | 5.28 | 19.41 | 1.42 | 1.32 |

TABLE 7

|  |  | Ex. 1 | Comp. Ex. 8 |
|---|---|---|---|
| Magnetic powder (mass part) | Flat magnetic powder (JEM-S) | 550 | 550 |
| Binder (mass part) | Acrylic rubber (SG80H-3) | 83 | 83 |
|  | Epoxy resin (1031S) | 23.1 | 23.1 |
| Curing agent | Cationic curing agent A | 6.9 | NA |
|  | Antimony-based curing agent (San-Aid SI-60L) | NA | 6.9 |
| Hot press | Press-retaining temperature (° C.) | 170 | 170 |
|  | Press-retaining duration (min.) | 5 | 5 |
|  | Press duration (min.) | 38 | 38 |
| Magnetic permeability | Initial magnetic permeability μ' (1 MHz) | 40.4 | 40.8 |
| Reliability test | Thickness before test (μm) | 293 | 303 |
|  | Thickness after test (μm) | 294 | 307 |
|  | Thickness changing rate (%) | 0.34 | 1.32 |
| Elution test | F-ion concentration (μm/mL) | 1.168 | 13.195 |
|  | F-ion concentration (μg/g) | 55.597 | 626.820 |
| Corrosion test | Cross-section observation | No corrosion | Corrosion at the edge |

TABLE 8

| Loss properties | Example 16 | Example 17 |
|---|---|---|
| 100 MHz | 2.58 | 3.25 |
| 500 MHz | 22.1 | 28.4 |
| 1 GHz | 55.48 | 62.1 |

From the results shown in Tables 2 to 6, it was found that the magnetic sheets of Examples 1 to 13, in which the curing agents each containing a sulfonium borate complex (the cationic curing agents A to C) were used, had excellent size-stability in the high-temperature high-humidity environment compared to the magnetic sheets of Comparative Examples 1 to 8 in which the imidazole-based curing agent or antimony-based curing agent was used as the curing agent. This can be seen from the fact that the rate of the change in the thickness in the reliability test of Examples is smaller than that of Comparative Examples, comparing the combination of Example and Comparative Example where only the used curing agents are different between them in the preparation condition of the magnetic sheet (e.g. Example 1 and Comparative Example 1; Example 1 and Comparative Example 8; Example 2 and Comparative Example 2; Example 3 and Comparative Example 3; Example 4 and Comparative Example 4; Example 5 and Comparative Example 5; Example 6 and Comparative Example 6; Example 8 and Comparative Example 1; Example 8 and Comparative Example 8; Example 9 and Comparative Example 2; Example 11 and Comparative Example 2).

Moreover, from the results shown in FIGS. 3A and 3B, and Table 7, it was found that the magnetic sheet of Example 1 could suppress elution of fluorine ions more than the magnetic sheet of Comparative Example 8, so that the magnetic sheet of Example 1 could prevent corrosion of the magnetic sheet. Note that, it is assumed that the corrosion seen on the surface of the magnetic sheet of FIG. 3B is the magnetic powder corroded by impurity ions (fluorine ions). As mentioned above, the magnetic sheet of Example 1 can prevent corrosion of wirings even when it is used around the wirings, as the magnetic sheet of Example 1 prevents elution of fluorine ions.

Moreover, it was found that the magnetic sheets of Examples 1 to 17 were suitably applied for RFID functioned mobile phones.

Furthermore, it was found that the magnetic sheet of Example 15 was usable even through it contained a large amount of the magnetic powder, which would easily cause cracking. This is because the magnetic sheet of Example 15 has a convex-concave forming layer (PET), and thus the magnetic sheet of Example 15 could maintain the shape thereof (as it was protected by the convex-concave forming layer (PET)).

Examples 16 and 17 showed high flame resistance in the combustion test (Table 4), and high electromagnetic wave-absorbing abilities in the measurement of LOSS properties (transmission loss) (Table 8).

The magnetic sheet of the present invention is suitably used for, for example, an electromagnetic noise depressor, an electromagnetic wave absorber, a magnetic shielding material, an electronic equipment having an IC tag function such as RFID and non-contact IC card, and is particularly suitably used for a RFID functioned mobile phone.

What is claimed is:

1. A method for producing a magnetic sheet comprising:
applying a magnetic sheet composition onto a substrate;
drying the magnetic sheet composition applied onto the substrate;
thermosetting the dried magnetic sheet composition,
wherein the magnetic sheet composition comprises:
a binder;
magnetic powder; and
a curing agent,
wherein the binder contains a thermosettinq organic resin, and the curing agent contains a sulfonium borate complex expressed by General Formula 1:

General Formula 1

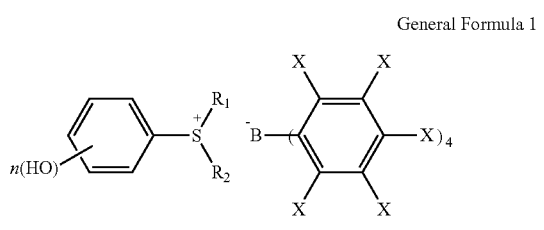

where $R_1$ is an aralkyl group, $R_2$ is a lower alkyl group, X is a halogen atom, and n is an integer of 0 to 3,
said method further comprising
stacking a convex-concave forming layer and a pattern transferring layer on a surface of a magnetic layer, which is formed by thermosetting the magnetic sheet composition, in this order from the side of the magnetic layer so as to form a stacked body; and
hot-pressing the stacked body so as to transfer a surface configuration of the pattern transferring layer to surfaces of the convex-concave forming layer and the magnetic layer, as well as bonding the convex-concave forming layer and the magnetic layer together.

where $R_1$ is an o-methyl benzyl group or a (1-naphthyl) methyl group, $R_2$ is a methyl group, a ethyl group, a propyl group, or a butyl group, X is a halogen atom, and n is an integer of 0 to 3; and
stacking a convex-concave forming layer and a pattern transferring layer on a surface of a magnetic layer, which is formed by thermosetting the magnetic sheet composition, in this order from the side of the magnetic layer so as to form a stacked body; and
hot-pressing the stacked body so as to transfer a surface configuration of the pattern transferring layer to surfaces of the convex-concave forming layer and the magnetic layer, as well as bonding the convex-concave forming layer and the magnetic layer together.

2. A method for producing a magnetic sheet, comprising:
applying a magnetic sheet composition onto a substrate;
drying the magnetic sheet composition applied onto the substrate; and
thermosetting the dried magnetic sheet composition,
wherein the magnetic sheet composition comprises:
a binder;
magnetic powder; and
a curing agent,
wherein the binder contains a thermosetting organic resin, and the curing agent contains a sulfonium borate complex expressed by General Formula 1:

General Formula 1

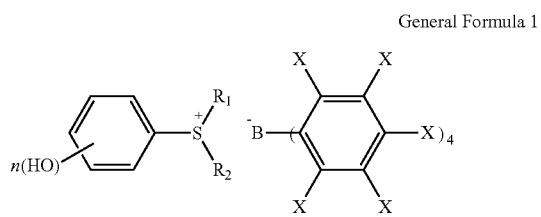

where $R_1$ is an aralkyl group, $R_2$ is a lower alkyl group, X is a halogen atom, and n is an integer of 0 to 3,
said method further comprising
stacking a convex-concave forming layer and a pattern transferring layer on a surface of a magnetic layer, which is formed by thermosetting the magnetic sheet composition, in this order from the side of the magnetic layer so as to form a stacked body; and
hot-pressing the stacked body so as to transfer a surface configuration of the pattern transferring layer to surfaces of the convex-concave forming layer and the magnetic layer, as well as bonding the convex-concave forming layer and the magnetic layer together.

* * * * *